United States Patent
Tu et al.

(10) Patent No.: US 9,057,961 B2
(45) Date of Patent: Jun. 16, 2015

(54) SYSTEMS AND METHODS FOR LITHOGRAPHY MASKS

(71) Applicant: Taiwan Semiconductor Manufacturing Company, Ltd., Hsin-Chu (TW)

(72) Inventors: Chih-Chiang Tu, Tauyen (TW); Hsin-Chang Lee, Zhubei (TW); Jong-Yuh Chang, Jhubei (TW); Chia-Jen Chen, Jhudong Township (TW); Chun-Lang Chen, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/336,231

(22) Filed: Jul. 21, 2014

(65) Prior Publication Data

US 2014/0335446 A1    Nov. 13, 2014

Related U.S. Application Data

(62) Division of application No. 13/486,015, filed on Jun. 1, 2012, now Pat. No. 8,785,083.

(51) Int. Cl.
| | | |
|---|---|---|
| *G03F 1/00* | (2012.01) | |
| *G03F 1/36* | (2012.01) | |
| *G03F 1/50* | (2012.01) | |
| *G03F 1/58* | (2012.01) | |
| *G03F 1/80* | (2012.01) | |

(52) U.S. Cl.
CPC .. *G03F 1/36* (2013.01); *G03F 1/50* (2013.01); *G03F 1/58* (2013.01); *G03F 1/80* (2013.01)

(58) Field of Classification Search
CPC ................................ G03F 1/36; G03F 1/50
USPC .................................................... 430/5
See application file for complete search history.

(56) References Cited

U.S. PATENT DOCUMENTS

| | | | |
|---|---|---|---|
| 7,767,366 | B2 | 8/2010 | Yoshikawa et al. |
| 8,003,284 | B2 | 8/2011 | Yoshikawa et al. |
| 8,012,654 | B2 | 9/2011 | Yoshikawa et al. |
| 2010/0261100 | A1 | 10/2010 | Yoshikawa et al. |
| 2010/0261101 | A1 | 10/2010 | Yoshikawa et al. |

*Primary Examiner* — Stewart Fraser
(74) *Attorney, Agent, or Firm* — Slater & Matsil, L.L.P.

(57) ABSTRACT

Structure of mask blanks and masks, and methods of making masks are disclosed. The new mask blank and mask comprise a tripe etching stop layer to prevent damages to the quartz substrate when the process goes through etching steps three times. The triple etching stop layer may comprise a first sub-layer of tantalum containing nitrogen (TaN), a second sub-layer of tantalum containing oxygen (TaO), and a third sub-layer of TaN. Alternatively, the triple etching stop layer may comprise a first sub-layer of SiON material, a second sub-layer of TaO material, and a third sub-layer of SiON material. Another alternative may be one layer of low etching rate $Mo_xSi_yON_z$ material which can prevent damages to the quartz substrate when the process goes through etching steps three times. The island mask is defined on the mask blank by using various optical proximity correction rules.

20 Claims, 3 Drawing Sheets

SYSTEMS AND METHODS FOR LITHOGRAPHY MASKS

RELATED CASES

This application is a divisional of U.S. patent application Ser. No. 13/486,015, filed on Jun. 1, 2012, and entitled, "Systems and Methods for Lithography Masks," which application is incorporated herein by reference.

BACKGROUND

In semiconductor processing, multiple lithography steps are generally used to form a semiconductor chip. These steps typically include forming a photoresist over a substrate, exposing the photoresist to a pattern of light generally controlled by a mask, developing the pattern in the photoresist to expose the underlying substrate, and etching the pattern in the underlying substrate. The pattern etched in the underlying substrate may be a basis for some feature formation, such as an ion impurity implantation such as for doping source and drain regions, a formation of a structure like a gate pattern, or a pattern for a conductive material such as in a metallization layer.

Photoresists may be classified into two groups: positive resists and negative resists. A positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The unexposed portion of the photoresist is dissolved by the photoresist developer.

Advances in semiconductor processing have generally allowed for continued reduction of minimum feature sizes for semiconductor chips, which have increased the requirement on the image resolution of the mask used in lithography. If a mask is not able to precisely form a pattern in a photoresist, the subsequently formed feature may not meet its critical dimension requirement.

For advanced lithography imaging, the improvement of resolution is one tough challenge. Conventional positive tone imaging (PTI) technology has reached its limit and cannot get any better image resolution with enough process window. The negative tone imaging (NTI) technology using a bright mask has the potential to provide a better resolution than the PTI technology using a dark mask. However, current NTI technology using a bright mask suffers serious substrate loss during the developing process. Therefore there is a need to develop a better bright mask used in the NTI technology for advanced lithography imaging.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely the structure of mask blanks and masks, and the methods of making masks. Through newly designed mask blank structures, new pattern sizing rules, and new process flows, lower quartz damage can be achieved for negative tone imaging (NTI) bright masks. The new mask blank and the new mask comprise a tripe etching stop layer which can prevent damages to the quartz substrate when the process goes through etching steps three times. The triple etching stop layer may comprise a first sub-layer of tantalum containing nitrogen (TaN), a second sub-layer of tantalum containing oxygen (TaO), and a third sub-layer of TaN. Alternatively, the triple etching stop layer may comprise a first sub-layer of SiON material, a second sub-layer of TaO material, and a third sub-layer of SiON material. Another alternative for the triple etching stop layer may be one layer of low etching rate $Mo_xSi_yON_z$ material which can prevent damages to the quartz substrate when the process goes through etching steps three times. The island mask is defined on the mask blank by using various optical proximity correction (OPC) rules.

Figure 1A:
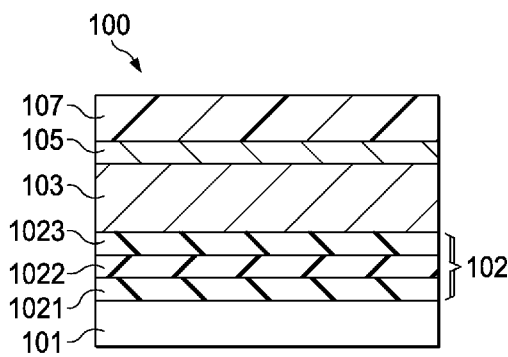
FIG. 1(a) illustrates an exemplary mask blank.
Figure 1B:
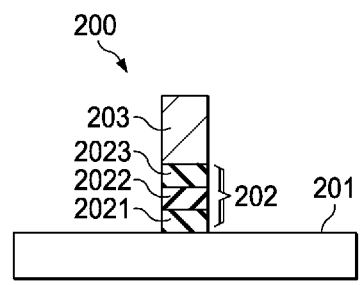
FIG. 1(b) illustrates an exemplary island mask formed on the mask blank shown in FIG. 1(a)

FIG. 1(a) illustrates an exemplary mask blank, and FIG. 1(b) illustrates an exemplary island mask formed on the mask blank shown in FIG. 1(a). A mask may be referred as a photo mask, or a photomask as well. The mask blank 100 illustrated in FIG. 1(a) comprises a substrate 101, a triple etching stop layer 102 made of three sub-layers 1021, 1022, and 1023 on the substrate 101, a shielding layer 103 on the triple etching stop layer 102, a hard mask layer 105 on the shielding layer 103, and a positive chemical amplified resist (PCAR) layer 107 on the hard mask layer 105. FIG. 1(b) illustrates an island mask 200 formed with the mask blank 100, wherein the island is formed on a substrate 201, comprising a triple etching stop layer 202 on the substrate made of three sub-layers 2021, 2022, and 2023, and a shielding layer 203.

Photomasks used for lithography contain the pattern of the integrated circuits. In a lithographic processing, integrated circuits are manufactured by exposing a pattern of features that are contained on a mask or a photomask onto a wafer. Light passing through the transparent portions of the mask activates light sensitive resist materials on the wafer that are then chemically and mechanically processed to create the circuit features. The basis of a mask is called a blank, or a mask blank. The manufacturing of photomasks on mask blanks is basically equal to the wafer fabrication. The difference is the exposure of the resist which is done by electron beams (photomasks) or with optical lithography (wafer).

There are many kinds of photomasks. An attenuated phase shift mask (APSM or AttPSM, also known as a half tone mask) may use a patterned layer of molybdenum silicide (MoSi) which represents the structures of the circuit. The molybdenum silicide layer has a thickness which causes a phase shift of the transmitted light of 180°. The mask 200 shown in FIG. 1(b) may be an APSM or a super binary mask made of more than two layers of materials.

The substrate 101 shown in FIG. 1(a) may be made of quartz or CaF2, which is optically transparent with respect to incident light. The substrate 101 may comprise a transparent substrate with a reflective material coated on a surface. The substrate 101 may be an industry standard thickness. The substrate 101 may be a variety of shapes including squares, circles, ovals, rectangles, etc. The substrate 101 may be a low thermal expansion material (LTEM), such as, ultra low expansion (ULE) glass manufactured by Corning.

A triple etching stop layer made of three sub-layers 1021, 1022, and 1023 may be formed on the substrate 101, which may be collectively referred as a triple etching stop layer 102. It may be referred as a barrier layer 102 as well. The triple etching stop layer 102 may be used as the stop layer for performing etching on the mask blank three times without damaging the substrate, which will be illustrated in FIGS. 2(a)-2(k). An exemplary triple etching stop layer 102 may comprise a first sub-layer of tantalum containing nitrogen (TaN) 1021 around a thickness of about 2~5 nm, a second sub-layer of tantalum containing oxygen (TaO) 1022 around a thickness of about 2~3 nm formed on the first sub-layer, and a third sub-layer of TaN 1023 around a thickness of about 2~5 nm formed on the second sub-layer. Such an exemplary triple etching stop layer may be called an NON etching stop layer due to the materials used. Some other materials may also be used, such as tantalum (Ta) alone, tantalum containing nitrogen and oxygen (TaON), tantalum containing boron (TaB), a composite material of them, or the like. Various structures such as TaO, $Ta_2O_3$, $TaO_2$, and $Ta_2O_5$ may exist.

The three sub-layers 1021, 1022, and 1023 may be of the same or different thickness, with a low reflectivity of about less than <15%, an extinction coefficient k ranged about 0.55~0.65, and a refractive index n ranged about 2.4~2.6. The triple etching stop layer 102 may be made by sputtering or physical vapor deposition (PVD) process or any related process.

Alternatively, the triple etching stop layer 102 may comprise a Nitride (SiON) for the first sub-layer 1021, a second sub-layer 1022 of TaO on the first sub-layer, and a third sub-layer of SiON on the second sub-layer. Another option for the triple etching stop layer 102 is to use one layer of any extremely lower etching rate $Mo_xSi_yON_z$ material instead of the three sub-layers 1021, 1022, 1023 as shown in FIG. 1(a), to be used as a stop layer for performing etching on the mask blank three times without damaging the substrate.

A shielding layer 103 may be formed on the triple etching stop layer 102. The shielding layer 103 may have a single-layer structure or a plural-layer structure. The shielding layer 103 may comprise molybdenum silicide oxynitride (MoSiON) material, or molybdenum silicon material. The shielding layer 103 may have a thickness around a range of 550~700° A, with an optical density (OD) in a range about greater than 3.0. The shielding layer 103 may have a light transmissivity from about 4% to 10%. When molybdenum silicon oxynitride is used, it has a light transmissivity of about 6%. The shielding layer 103 may be made by sputtering or PVD process.

The shielding layer 103 may be replaced by a half-tone layer or a half-tone phase shift layer 103 formed on the triple etching stop layer 102. The half-tone phase shift layer 103 or the half-tone layer 103 is able to produce a 180 Å° phase shift on the light passing through. The half-tone layer 103 may comprise a material selected from, for example, chromium oxy-nitride (CrON), chromium oxide (CrO), molybdenum silicon oxy-nitride ($MoSi_zO_xN_y$), amorphous carbon or silicon nitride (SiN). The half-tone layer 103 may have a thickness around a range of 550~700° A, with an optical density in a range greater than 3.0. The half-tone layer 103 may have a light transmissivity about a range from 4% to 10%. The half-tone layer 103 may be made by sputtering or PVD process.

A hard mask layer 105 may be formed on the shielding layer 103 or the half tone layer 103. The hard mask layer may be made of chrome. The hard mask layer 105 may be made by sputtering process or PVD process. The hard mask 105 may have a thickness in a range of about 50~100° A.

A positive chemically amplified resist (PCAR) layer may be coated onto the surface of the hard mask 105, with 800~1500° A resist coating. The use of chemical amplification is to increase the sensitivity to the exposure energy in order to combat the larger absorption at shorter wavelengths. A PCAR may be a commercially available product, such as SEBP-9012 or SEC-9012, SEC-9093, from Shin-Etsu Chemical Co., Ltd.

The mask blank shown in FIG. 1(a) can be used to form an island mask shown in FIG. 1(b). The structure shown in FIG. 1(b) comprises a substrate 201 which is equivalent to the substrate 101 of FIG. 1(a), an island on the substrate, formed by a triple etching stop layer 202 and a shielding layer 203. The triple etching stop layer 202 on the substrate comprising three sub-layers 2021, 2022, and 2023, which are part of the triple etching stop layer 102 after the rest of the sub-layers have been etched away in the process. A shielding layer or a half-tone layer 203 on the triple etching stop layer 202 is part of the shielding layer or the half-tone layer 103 shown in FIG. 1(a), after the rest of the layer 103 has been etched away in the process.

Figure 2A:
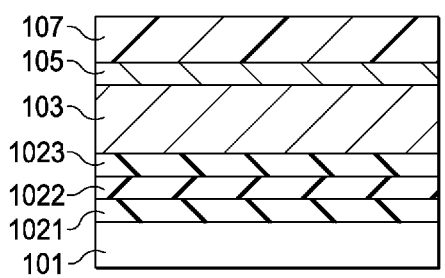
FIGS. 2(a)-2(k) illustrate an exemplary process of making the island mask shown in FIG. 1(b) from the mask blank shown in FIG. 1(a)
Figure 2B:
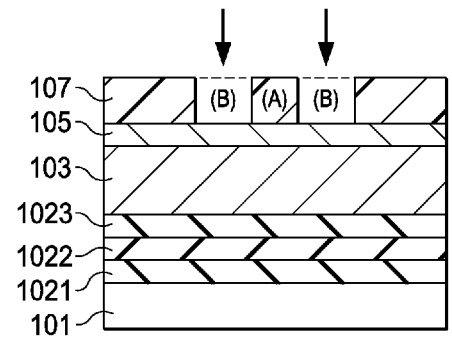
Figure 2C:
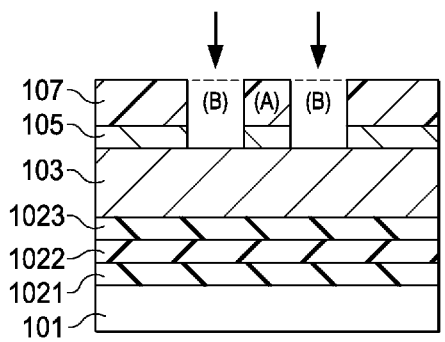
Figure 2D:
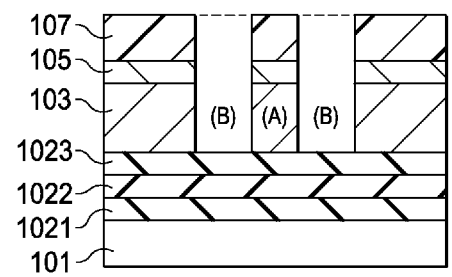
Figure 2E:
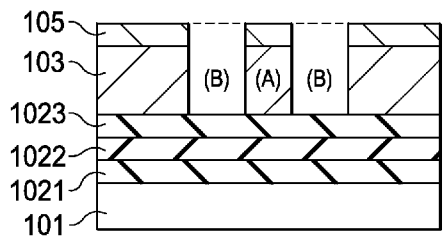
Figure 2F:
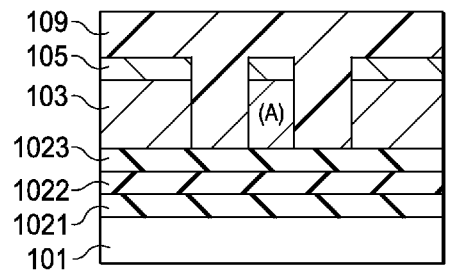
Figure 2G:
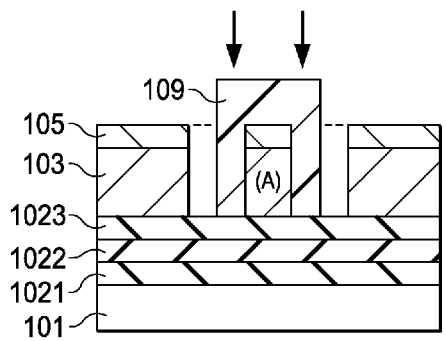
Figure 2H:
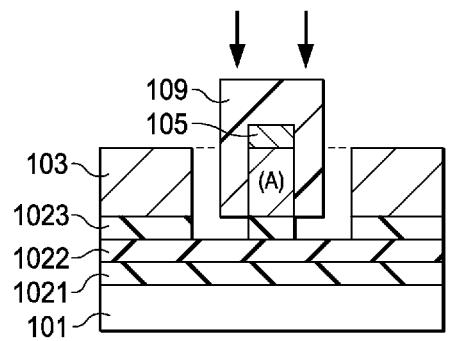
Figure 2I:
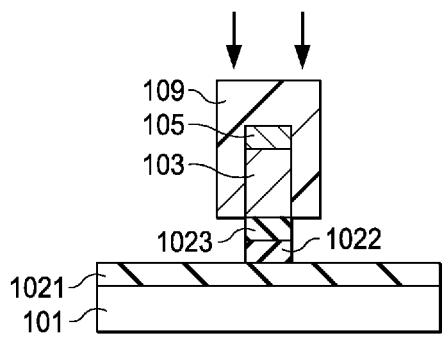
Figure 2J:
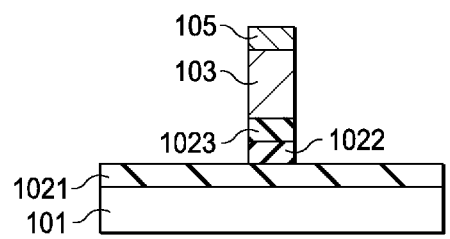
Figure 2K:
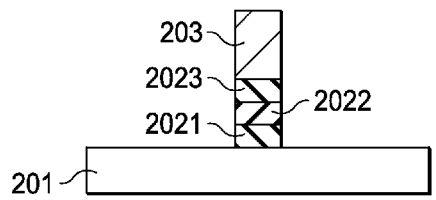

FIGS. 2(a)-2(k) illustrate an exemplary process of making the island mask shown in FIG. 1(b) from the mask blank shown in FIG. 1(a). FIG. 2(a) is the same mask blank shown in FIG. 1(a), and FIG. 2(k) is the same island mask shown in FIG. 1(b).

In the process shown in FIGS. 2(a)-2(k), dry etching will be performed, in various etching mode such as the endpoint plasma etching mode, the time mode, or the over etching mode. The dry etching may be performed using a fluorine-based gas such as $SF_6$, $CF_4$, $C_2F_6$, or $CHF_3$ in dry etching of a tantalum-based material. The dry etching may be performed using a chlorine-based gas such as $Cl_2$ or $CH_2Cl_2$, He, $H_2$, $N_2$, Ar, $C_2H_4$, or the like. The dry etching may also be performed using a mixed gas of a fluorine-based gas and a chlorine-based gas, or a mixture of chlorine and oxygen gas.

As illustrated in FIG. 2(b), an island or contact island A of the PCAR layer 107 has a size equal to the size of the final island mask 203 shown in FIG. 2(k), in addition to any tool bias correction needed. The size here may refer to the width at the cross-section view. It may refer to the diameter or other measurement when needed in other view. The island A is surrounded by a ring trench B on both sides.

In order to develop the final mask, a plurality of optical proximity correction (OPC) rules is used. The addition of tool bias correction in the size is such an OPC rule. Due to wave optics (e.g. diffraction) there can be aberration during the exposure of photomasks. Thus the OPC rules have been introduced in semiconductor manufacturing, which can eliminate or reduce image defects. OPC means to modify the structures on the mask in such a way that the shape of the image on the masks looks like desired. Furthermore there can be additional structures just for minimizing aberration which do not have any function for the integrated device itself.

Figure 3A:
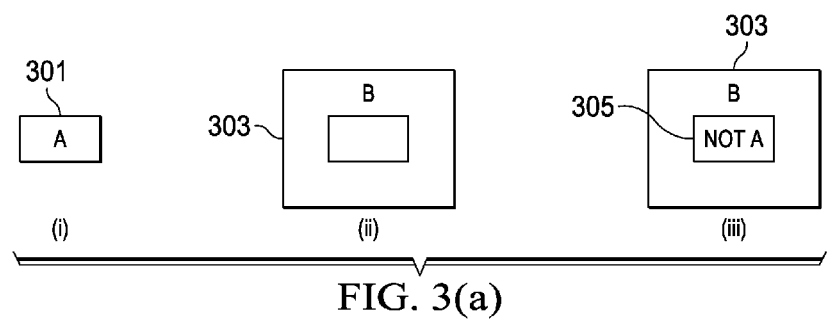
FIGS. 3(a) and 3(b) illustrate the optical proximity correction (OPC) rules used in forming the island shown in FIG. 1(b).
Figure 3B:
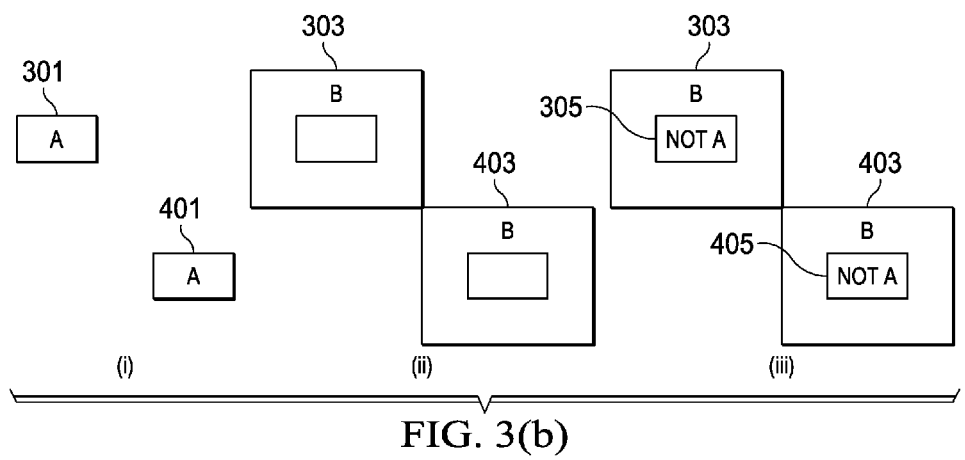

The OPC rules applied in the step at FIG. 2(b) are shown in more details in FIGS. 3(a) and 3(b). The size of the island A is the final island size in addition to any tool bias correction needed, where the tool bias correction size may be in a range about 6~20 nm. In order to develop an island A of FIG. 2(b) surrounded by a ring trench B, a two-step process shown in FIG. 3(a) may be followed.

In the first step shown in FIG. 3(a)(ii), a larger shape B shown as 303 surrounding the shape of the island A shown as 301 is first defined. The shape B may be an intermediate shape. The expansion of the shape of the island A to the shape B is defined by either Rule 1 or Rule 2. The shape B may be obtained by Rule 1, where the shape of the island A is expanded in all sides by 2 um. The shape B may be obtained by Rule 2, where the shape of the island A is expanded on all sides by half a size of the critical dimension (CD), which may be less than 2 um. The choice of either Rule 1 or Rule 2 depends on the density of device layouts. As shown in FIG. 3(b), the expansions of the different shapes of 301 and 401 are kept as much disjoint as possible. But it can be overlapped if needed.

In the second step shown in FIG. 3(a)(iii), a "NOT A" operation is performed on the B shape. The NOT A operation takes out the shape of the island A from the intermediate B shape, so that the remaining part of B is along the edges of the shape of the island A, and surrounding the shape of island A on all sides like a ring structure, as shown in FIG. 3(a)(iii). The remaining part of B is used to generate the first exposure area, which is along the edges of the island A. A cross-section view of the result is shown in FIG. 2(b), where the remaining part of B defines a ring trench B lies on both sides of A.

In summary, the size of the island A may be defined by an OPC rule: size (A) is equal to a final island mask size plus a tooling bias, where the tooling bias is equal to the first and the second exposure alignment overlap error and bias in the current exemplary process flow. If any additional exposure is used, then the tooling bias would take into consideration of such bias as well. The shape B is defined by a second OPC rule: shape (B) is obtained by expanding all side of the shape of island A by an expansion size, where the expansion size is about 1~2 um for a more isolated pattern, and the expansion size is about ½* (smallest space critical dimension) for a dense device layout. The third OPC rule is to Perform (B) NOT (A) rule to generate the first exposure area as shown in FIG. 2(b). The exposure area will be along the edges of the island A like a ring around the island A.

As illustrated in FIG. 2(b), the PCAR layer 107 has a ring trench B surrounding the island A. The island A of the PCAR layer 107 has a size as the size of the final island mask 203 shown in FIG. 2(k), in addition to any tool bias correction needed. The ring trench B is formed by the shape shown in FIG. 3(a)(iii).

As illustrated in FIG. 2(c), the hard mask layer etching is performed to expand the ring trench B along both sides of A, to the hard mask layer 105. The etching may be done using chemical Cl2/O2 as an example.

As illustrated in FIG. 2(d), the shielding layer or the half-tone layer etching may be performed to expand the ring trench B along both sides of A, to the shielding layer or the half-tone layer 103. The etching may be done using chemical SF6/O2 as an example.

As illustrated in FIG. 2(e), the PCAR layer 107 is completely stripped. As the result, a well-defined contact island A with ring trench B is now made. By this stage, the remaining process behavior will almost be the same as PTI-dark mask making A good critical dimension control of the contact island can be achieved without being impacted by any loading difference.

As illustrated in FIG. 2(f), a second round photoresist layer 109 may be coated onto the surface of the remaining pattern to protect the contact island A. The second round photoresist may be a negative chemically amplified resist (NCAR) or a PCAR. Examples of an NCAR may be a commercially available product, such as SEC-2014 from Shin-Etsu Chemical Co., Ltd. The NCAR layer 109 fills the ring trench B and further covers the surface of the hard mask layer 105. The NCAR layer 109 may be with 800~1500° A thickness on the surface of the hard mask layer 105.

As illustrated in FIG. 2(g), the NCAR layer 109 is exposed with an e-beam or an optical tool on the part to be kept. Developing process can then be performed so that only a part of the NCAR layer 109 remains on the contact island A. The developing process can be done by using a diluted alkaline developing solution or a deionized water (DIW) solution containing about 0.05 to 0.37 weight percent tetramethylammonium hydroxide (TMAH). Full puddle developing method may be used with static and dynamic swing 60~120 sec. The total remaining NCAR layer 109 may be over 50% in the ring trench B area to afford the etching loading effect.

As illustrated in FIG. 2(h), an etching of the hard mask layer 105 may be performed to remove the hard mask layer 105 not covered by the photoresist layer 109, which is separated from the island A. The etching may be an endpoint mode plasma etching, done with Cl2/O2 at 200/10 sccm, under 4 mT pressure. Through this etching step, the top sub-layer 1023 of the triple etching stop layer 102 is also etched away. The plasma etching also performs lateral etching so that the sub-layer 1023 under the NCAR 109 is etched away as well.

As illustrated in FIG. 2(i), an etching of shield layer or half-tone layer 103 may be performed to remove the shield layer or half-tone layer 103 not covered by the photoresist layer 109, which is separated from the island A. The etching may be an endpoint mode plasma etching, done with SF6/O2=5/60 sccm, under 4 mT pressure. Through this etching process, the second sub-layer 1022 of the triple etching stop layer 102 may also be etched away. The plasma etching also performs lateral etching so that the sub-layer 1022 under the NCAR 109 is etched away as well.

As illustrated in FIG. 2(j), the remaining NCAR layer 109 is completed removed, so that the hard mask layer 105 and the shielding layer 103 over the island A is not covered by NCAR layer 109 anymore. In the illustration, a NCAR layer is used. The procedure would operate similarly if a PCAR layer is used as the photoresist layer 109 at step shown in FIG. 2(f).

Finally, as illustrated in FIG. 2(k), an etching of the hard mask layer 105 may be performed to remove the hard mask layer 105 remaining on top of the shielding layer 103 at the island. The etching condition can be the same as previous etching of the hard mask layer 105 shown in FIG. 2(h). Through this etching process, the third sub-layer 1021 of the triple etching stop layer 102 may also be etched away. As a result, a final island mask is formed shown in FIG. 2(k). It is an NTI-bright mask with good critical dimension quality control and without quartz damage is produced.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of making a mask, comprising:
providing a mask blank having a substrate, a triple etching stop layer on the substrate, a shielding layer on the triple etching stop layer, a hard mask layer on the shielding layer, and a first positive chemical amplified resist (PCAR) layer on the hard mask layer;
forming a ring trench of a first size around an island of a second size on the first PCAR layer, wherein the first size and the second size are obtained by a plurality of optical proximity correction (OPC) rules based on a final island mask size;
extending the ring trench on the first PCAR layer to the hard mask layer, and further to the shielding layer;
removing the first PCAR layer;
forming a second photoresist layer covering the ring trench and on a surface of the island;
removing a part of the second photoresist layer within the ring trench and the second photoresist layer outside the island;
etching the hard mask layer separated from the island and uncovered by the second photoresist layer, and etching a part of a first sub-layer of the triple etching stop layer;
etching the shielding layer separated from the island and uncovered by the second photoresist layer, and etching a part of a second sub-layer of the triple etching stop layer;
removing the second photoresist layer around the island to uncover the hard mask layer on the island; and
etching the hard mask layer on the island to form the final island mask.

2. The method of claim 1, wherein:
the second size of the island is obtained by an OPC rule adding a size of tooling bias to the final island mask size.

3. The method of claim 1, wherein:
the ring trench of the first size around the island of the second size is obtained by expanding a shape of the island on all sides by an expansion size to result in an intermediate shape, and removing portions of the first PCAR layer outside the shape of the island but covered by the intermediate shape.

4. The method of claim 3, wherein the expansion size is 2 μm.

5. The method of claim 3, wherein the expansion size is half a size of a critical dimension.

6. The method of claim 1, wherein the triple etching stop layer includes a first sub-layer comprising TaN, a second sub-layer on the first sub-layer and comprising TaO, and a third sub-layer on the second sub-layer and comprising TaN.

7. The method of claim 1, wherein the triple etching stop layer includes a first sub-layer comprising SiON, a second sub-layer on the first sub-layer and comprising TaO, and a third sub-layer on the second sub-layer and comprising SiON.

8. The method of claim 1, wherein the steps of etching the hard mask layer include dry etching an etchant gas selected from the group consisting of $SF_6$, $CF_4$, $C_2F_6$, $CHF_3$, $Cl_2$, $CH_2Cl_2$, He, $H_2$, $N_2$, Ar, $C_2H_4$, and combinations thereof.

9. The method of claim 1, wherein the triple etching stop layer comprises $Mo_xSi_yON_z$.

10. A method of making a mask, comprising:
providing a mask blank having a substrate,
forming on the substrate a triple etching stop layer on the substrate, the triple etching stop layer including a first sub-layer of SiON material, a second sub-layer of TaO material on the first sub-layer, and a third sub-layer of SiON material on the second sub-layer;
forming a shielding layer on the triple etching stop layer;
forming a hard mask layer on the shielding layer; and
forming a first positive chemical amplified resist (PCAR) layer on the hard mask layer.

11. The method of claim 10, further comprising:
forming a ring trench of a first size around an island of a second size on the first PCAR layer, wherein the first size and the second size are obtained by a plurality of optical proximity correction (OPC) rules based on a final island mask size;
extending the ring trench on the first PCAR layer to the hard mask layer, and further to the shielding layer;
removing the first PCAR layer;
forming a second photoresist layer covering the ring trench and on a surface of the island;
removing a part of the second photoresist layer within the ring trench and the second photoresist layer outside the island;
etching the hard mask layer separated from the island and uncovered by the second photoresist layer, and etching a part of a first sub-layer of the triple etching stop layer;
etching the shielding layer separated from the island and uncovered by the second photoresist layer, and etching a part of a second sub-layer of the triple etching stop layer;
removing the second photoresist layer around the island to uncover the hard mask layer on the island; and
removing the hard mask layer from the island.

12. The method of claim 11, wherein:
the second size of the island is obtained by an OPC rule adding a size of tooling bias to the final island mask size.

13. The method of claim 11, wherein:
the ring trench of the first size around the island of the second size is obtained by expanding a shape of the island on all sides by an expansion size to result in an intermediate shape, and removing portions of the first PCAR layer covered by the intermediate shape and extending outside the shape of the island.

14. The method of claim 11, wherein forming a second photoresist layer comprises depositing a negative chemically amplified resist (NCAR).

15. The method of claim 14, wherein the NCAR substantially fills the ring trench.

16. A method of making a mask, comprising:
providing a mask blank having a substrate, a triple etching stop layer on the substrate, a shielding layer on the triple etching stop layer, a hard mask layer on the shielding layer, and a first positive chemical amplified resist (PCAR) layer on the hard mask layer;
etching a ring pattern through the first PCAR layer, the hard mask layer, and the shielding layer to form an island pattern in the first PCAR layer, the hard mask layer, and the shielding layer;
removing the first PCAR layer;
forming a sacrificial layer covering the island pattern and filling the ring pattern;

removing a part of the sacrificial layer to form a sacrificial island covering the island pattern and within the ring pattern, wherein the sacrificial island leaves an exposed portion of the hard mask layer not covering the island pattern;

etching the exposed portion of the hard mask layer, and etching a part of a first sub-layer of the triple etching stop layer within the ring pattern;

removing a portion of the shielding layer not covered by the sacrificial island;

removing a sub-layer of the triple etching stop layer not covered by the sacrificial island;

removing the sacrificial island to expose the hard mask layer on the island; and removing the hard mask layer on the island pattern.

17. The method of claim 16, wherein the triple etching stop layer has a first sub-layer comprising either TaN or SiON, a second sub-layer comprising TaO, and a third sub-layer comprising either TaN or SiON.

18. The method of claim 17, wherein the step of etching the exposed portion of the hard mask layer comprises exposing the exposed portion of the hard mask to a fluorine-based gas, a chlorine-based gas, or a mixture of a chlorine and oxygen gas.

19. The method of claim 16, wherein the step of forming a sacrificial layer covering the island pattern and filling the ring pattern comprises depositing a photoresist layer.

20. The method of claim 16, wherein the island pattern corresponds to a feature to be formed on an integrated circuit device.

* * * * *